(12) United States Patent
Chen et al.

(10) Patent No.: US 8,643,125 B2
(45) Date of Patent: Feb. 4, 2014

(54) STRUCTURE AND PROCESS FOR MICROELECTROMECHANICAL SYSTEM-BASED SENSOR

(75) Inventors: Lung-Tai Chen, Kaohsiung (TW); Shih-Chieh Lin, Kaohsiung (TW); Yu-Wen Hsu, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/327,681

(22) Filed: Dec. 15, 2011

(65) Prior Publication Data
US 2013/0099331 A1    Apr. 25, 2013

(30) Foreign Application Priority Data
Oct. 20, 2011    (TW) .............................. 100138026 A

(51) Int. Cl.
*H01L 29/78*    (2006.01)

(52) U.S. Cl.
USPC ........... 257/412; 257/413; 257/415; 257/416; 257/417; 438/48; 438/50; 438/51; 438/52; 438/106

(58) Field of Classification Search
USPC .......... 257/412, 413, 415, 416, 417, E21.092, 257/E21.115, E21.606–E21.696, E29.324; 438/48, 50, 51, 52, 106, 414, 456, 438/117–119, 458, 902
See application file for complete search history.

(56) References Cited

U.S. PATENT DOCUMENTS

| 6,121,552 A | 9/2000 | Brosnihan et al. |
| 6,936,491 B2 | 8/2005 | Partridge et al. |
| 2005/0255645 A1* | 11/2005 | Lutz et al. ..................... 438/202 |
| 2012/0001276 A1* | 1/2012 | Huang et al. .................. 257/416 |

OTHER PUBLICATIONS

Di Zhang et al., "A Novel Wafer Level Hermetic Packaging for MEMS Devices Using Micro Glass Cavities Fabricated by a Hot Forming Process," 2010 11th International Conference on Electronic Packaging Technology & High Density Packaging, 2010, pp. 921-924, IEEE, US.

A. R. Mirza, "Wafer-Level Packaging Technology for MEMS," 2000 Inter Society Conference on Thermal Phenomena, 2000, pp. 113-119, IEEE, US.

Thomas F. Marinis et al., "Wafer Level Vacuum Packaging of MEMS Sensors," 2005 Electronic Components and Technology Conference, 2005, pp. 1081-1088, IEEE, US.

Ryszard J. Pryputniewicz et al., "Development of Packaging for MEMS Inertial Sensors," 2004, pp. 56-62, IEEE, US.

* cited by examiner

*Primary Examiner* — Steven Loke
*Assistant Examiner* — Junaiden Mirsalahuddin

(57) ABSTRACT

A structure and a process for a microelectromechanical system (MEMS)-based sensor are provided. The structure for a MEMS-based sensor includes a substrate chip. A first insulating layer covers a top surface of the substrate chip. A device layer is disposed on a top surface of the first insulating layer. The device layer includes a periphery region and a sensor component region. The periphery region and a sensor component region have an air trench therebetween. The component region includes an anchor component and a moveable component. A second insulating layer is disposed on a top surface of the device layer, bridging the periphery region and a portion of the anchor component. A conductive pattern is disposed on the second insulating layer, electrically connecting to the anchor component.

8 Claims, 8 Drawing Sheets

STRUCTURE AND PROCESS FOR MICROELECTROMECHANICAL SYSTEM-BASED SENSOR

CROSS REFERENCE TO RELATED APPLICATIONS

This application claims priority of Taiwan Patent Application No. 100138026, filed on Oct. 20, 2011, the entirety of which is incorporated by reference herein.

BACKGROUND OF THE INVENTION

1. Field of the Invention

The present invention relates to a structure and a fabrication process for a microelectromechanical system (MEMS)-based sensor, and in particular, to conductive lines and a fabrication process for conductive lines of a microelectromechanical system (MEMS)-based sensor.

2. Description of the Related Art

Microelectromechanical system (MEMS) devices have been integrated in industries related to our daily lives, for example, the guiding device industry, gaming industry, portable communication industry, and electrical vehicle and motorcycle industry. Additionally, in view of the need for global market information, demand for sensor devices or sensor system modules have increased, thus, high growth for MEMS devices is expected.

However, the conventional MEMS device disposed on a glass substrate has some disadvantages, for example, a thickness of the glass substrate is limited by the technology of the glass polishing process, which is currently insufficient. Thus, the total thickness of the MEMS device can not be reduced. Additionally, the conductive lines disposed between the glass substrate and anchor components of the conventional MEMS device are thin and fine, wherein an additional protective oxide layer is required to be disposed on the anchor components to protect the conductive lines from deformation and displacement. Moreover, for the sake of ensuring that the contact quality is satisfactory among the anchor components, the conductive lines and the glass substrate, an additional metal contact layer is required for disposal to facilitate performing a physical embedding process to the conductive lines with the anchor components. Therefore, the bonding area is hardly improved. Further, the fabrication process of the conventional MEMS device uses an etching process to form components. Therefore, variation of the component thickness is hardly controlled.

Thus, a novel structure and fabrication process for a microelectromechanical system (MEMS)-based sensor having thinness, low device cost, high stability and high reliability are desired to improve the aforementioned disadvantages.

BRIEF SUMMARY OF INVENTION

A structure and a fabrication process for a microelectromechanical system (MEMS)-based sensor are provided. An exemplary embodiment of a structure for a MEMS-based sensor, comprises a substrate chip. A first insulating layer covers a top surface of the substrate chip. A device layer is disposed on a top surface of the first insulating layer, wherein the device layer comprises a periphery region and a sensor component region, and the periphery region and a sensor component region have an air trench therebetween, wherein the component region includes an anchor component and a moveable component. A second insulating layer is disposed on a top surface of the device layer, bridging the periphery region and a portion of the anchor component. A conductive pattern is disposed on the second insulating layer, electrically connecting to the anchor component.

An exemplary embodiment of a fabrication process for a MEMS-based sensor comprises providing a substrate chip. A first insulating layer is deposited on a top surface of the substrate chip. A first bonding process is performed to dispose a silicon-on-insulator wafer on a top surface of the first insulating layer, wherein the silicon-on-insulator wafer comprises a handle layer. A device layer has an air trench between a periphery region and a sensor component region of the device layer. A second insulating layer is disposed between the handle layer and the device layer, wherein the device layer contacts the first insulating layer. The handle layer is totally removed from the silicon-on-insulator wafer. A portion of the second insulating layer is removed to form a second insulating layer pattern, so that the sensor component region of the device layer is exposed from the second insulating layer pattern, and the second insulating layer pattern bridges the periphery region and a portion of the anchor component. A conductive pattern is formed on the second insulating layer pattern, which extends to connect to the device layer exposed from the second insulating layer pattern.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1A:
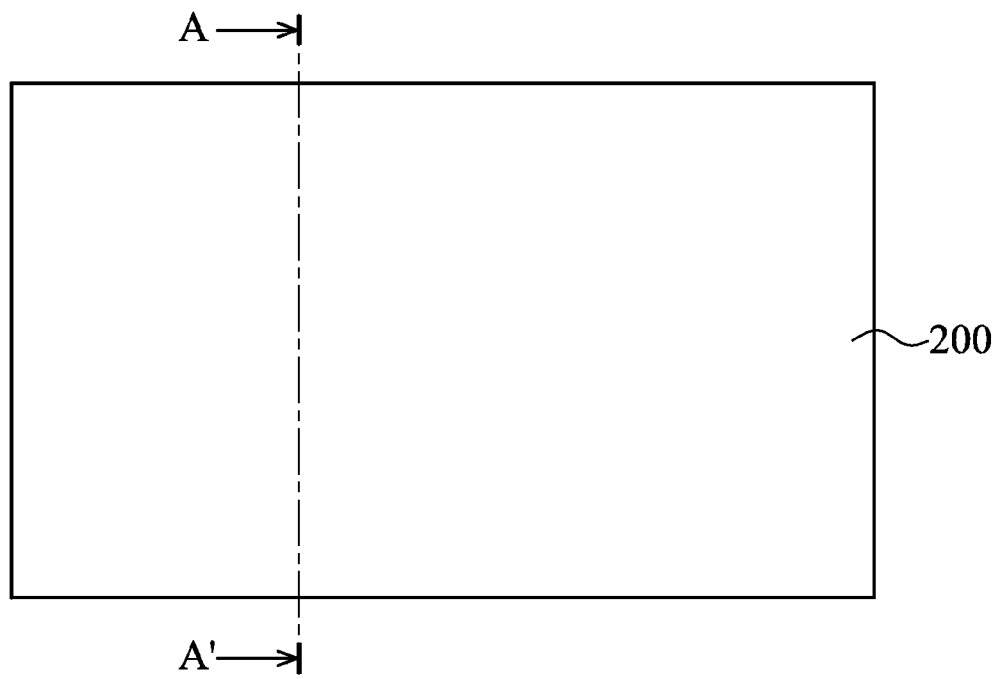
FIGS. 1a, 2a, 3a, 4a, 5a and 6a are top views showing one exemplary embodiment of a fabrication process for a microelectromechanical system-based sensor of the invention.
Figure 1B:
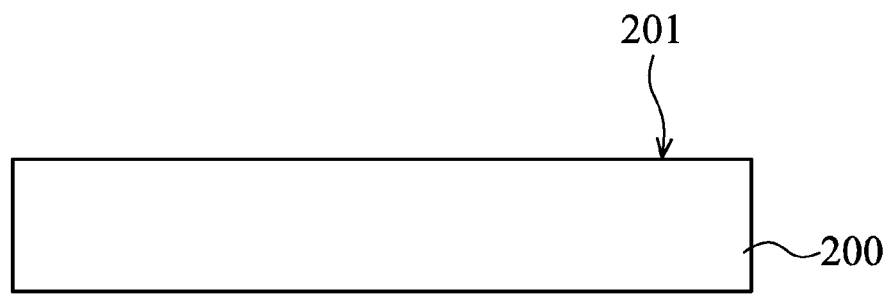
FIGS. 1b, 2b, 3b and 4b are cross sectional views taken along lines A-A' of FIGS. 1a, 2a, 3a and 4a, respectively.

The following description is of a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

FIGS. 1a, 2a, 3a, 4a, 5a and 6a are top views showing one exemplary embodiment of a fabrication process for a microelectromechanical system (MEMS)-based sensor 500a of the invention. FIGS. 1b, 2b, 3b and 4b are cross sectional views taken along lines A-A' of FIGS. 1a, 2a, 3a and 4a, respectively. FIGS. 5b and 6b are cross sectional views taken along lines C-C' of FIGS. 5a, and 6a, respectively. One exemplary embodiment of a MEMS based sensor 500a may comprise an oscillator, a gyroscope or a magnetometer. In this embodiment, the MEMS based sensor 500a as shown in FIGS. 1a-6b may be an oscillator, but the embodiment does not limit the invention scope. Please refer to FIGS. 1a and 1b, firstly, a substrate chip 200 is provided. In one embodiment, the substrate chip may comprise a semiconductor chip such as a silicon chip. In another embodiment, a mask pattern (not shown), for example, a photoresist pattern, may be formed on a top surface 201 of the substrate chip 200 to define a position of a recess region. Next, an anisotropic etching process is performed to remove a portion of the substrate chip 200 from the top surface 201 of the substrate chip 200 to form a recess region 202. Finally, the mask pattern is removed. The position of the recess region 202 is corresponding to a position of a moveable component of the resulting MEMS based sensor 500a, so that the moveable component can disposed therein and freely move therein.

Figure 2A:
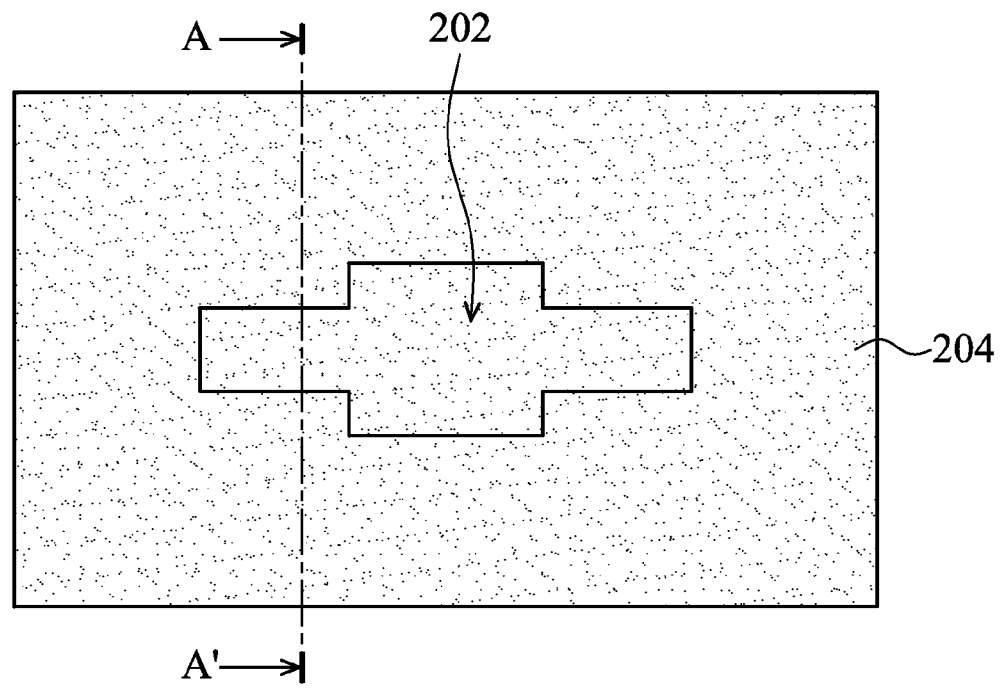
Figure 2B:
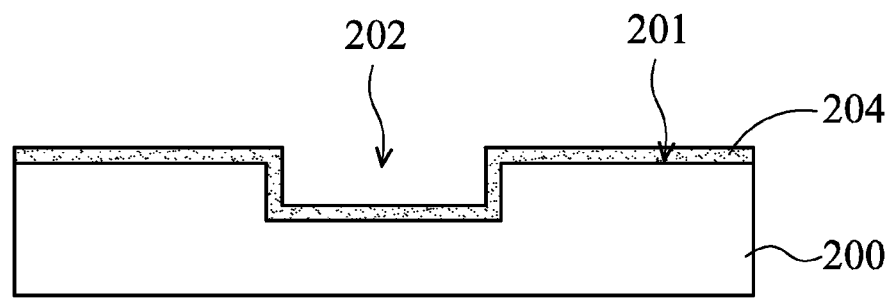

Please refer FIGS. 2a and 2b, next, a first insulating layer 204 is conformably disposed on the top surface 201 of the substrate chip 200 using a deposition process comprising a chemical vapor deposition (CVD) or atomic layer deposition (ALD). In one embodiment, the first insulating layer 204 may be a silicon oxide layer.

Figure 3A:
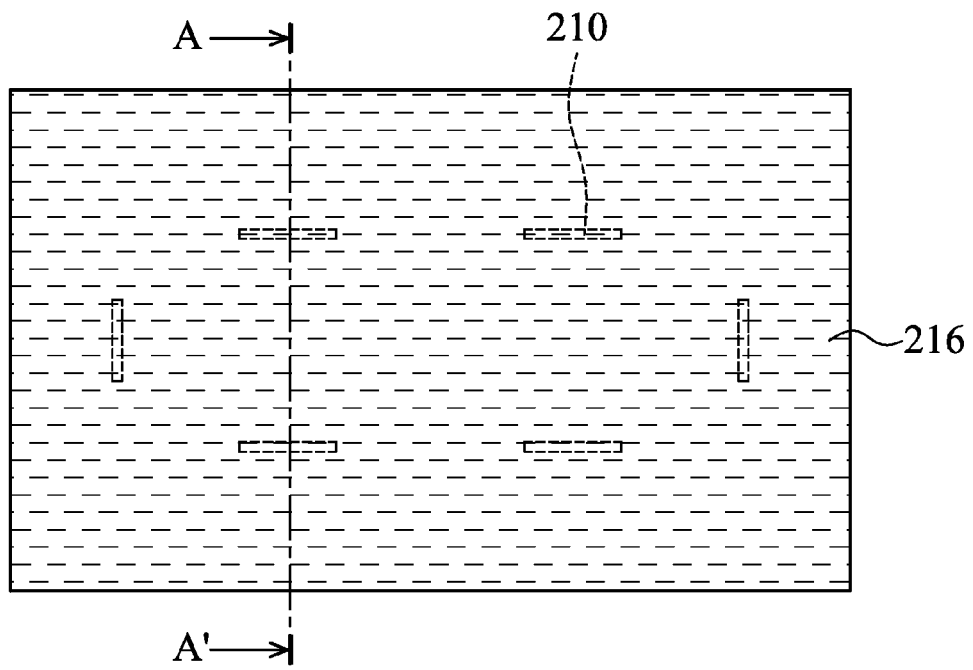
Figure 3B:
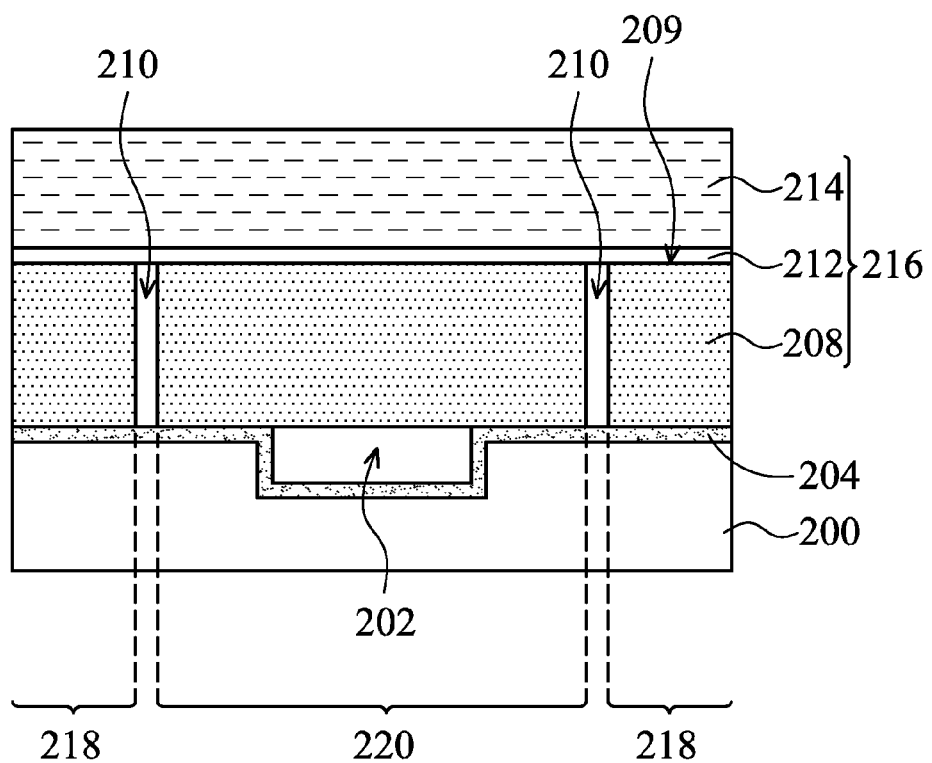

Please refer FIGS. 3a and 3b, next, a silicon-on-insulator (SOI) wafer 216 is provided. In one embodiment, the SOI wafer 216 may comprise a device layer 208, a handle layer 214, and a second insulating layer 212 disposed therebetween.

Next, trenches 210 are formed in the device layer 208 of the SOI wafer 216 to define a boundary position of an anchor component of the resulting MEMS based sensor 500a. The formation of the trenches 210 comprises forming mask patterns (not shown) on the device layer 208. Next, an anisotropic etching process is performed to remove the device layer 208 not covered by the mask patterns, thereby forming the trenches 210 through the device layer 208. Also, the first insulating layer 204 may serve as an etching stop layer for the anisotropic etching process. Finally, the mask patterns are removed. As shown in a cross section view of FIG. 3b, the trenches 210 are laterally between the sensor component region 220 and the periphery region 218 of the device layer 208. In this embodiment, the trenches 210 are used to laterally separate anchor components on the sensor component region 220 of the resulting MEMS based sensor 500a from the periphery region 218. The trench 210 is used for electrical and spacing isolation. The trenches 210 are not filled with anything and covered by a liner, and a sidewall of the trench 210 directly contacts the air (that is to say, the trenches 210 are filled by the air), so that the trenches 210 may serve as air trenches 210.

Next, a bonding process is performed to dispose the SOI wafer 216 on a top surface 205 of the first insulating layer 204. The bonding process disposes the device layer 208 on the surface 205 of the first insulating layer 204. In one embodiment, the bonding process may comprise a eutectic bonding process, a high pressure bonding process or a hot pressing bonding process. The quality of the bonding process can be improved due to the device layer 208 and the first insulating layer 204 both comprising a silicon-containing material. Also, the resulting MEMS based sensor 500a can dramatically reduce a sense drifting problem caused by the thermal stress. As shown in FIG. 3b, the device layer 208 comprises a periphery region 218 and a sensor component region 220 surrounded by the periphery region 218. In one embodiment, a thinning process may be performed after performing the bonding process to remove a portion of the substrate chip 200 from a back side surface 203 thereof, thereby reducing a thickness of the substrate chip 200.

Figure 4A:
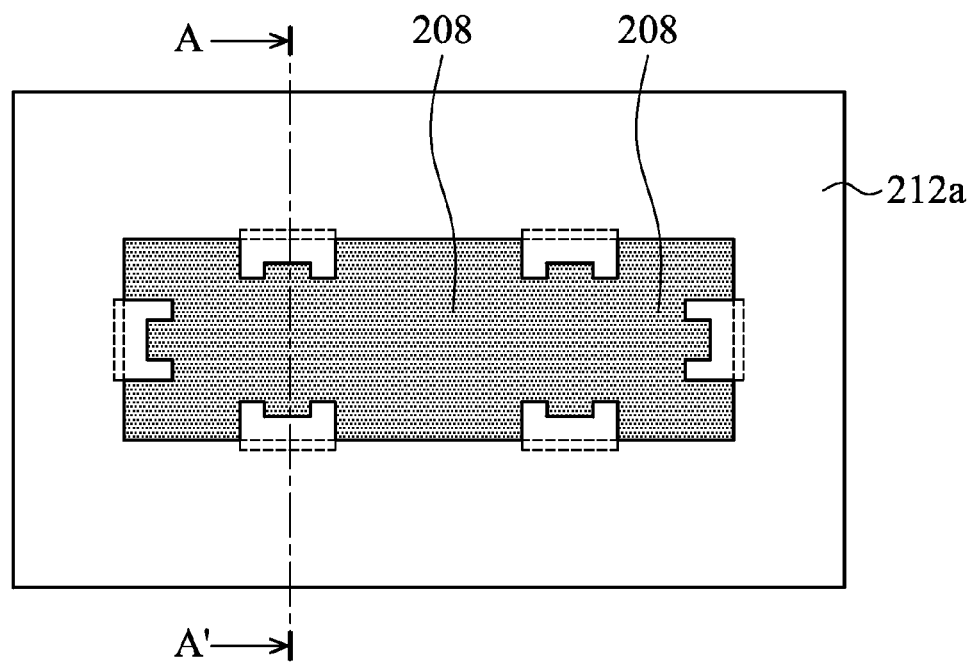
Figure 4B:
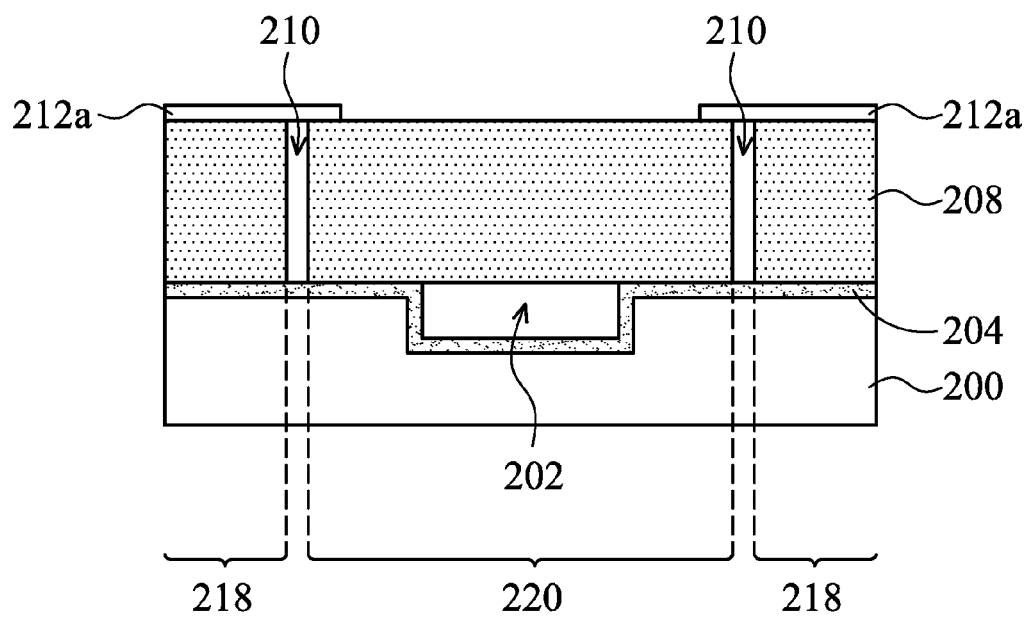

Next, please refer to FIGS. 4a and 4b, wherein an etching process may be performed to totally remove the handle layer 214 from the SOI wafer 216. Next, a mask pattern (not shown) can be formed on the second insulating layer 212 to define positions of the subsequent anchor component and the movement component. Next, an anisotropic etching process is performed to remove the second insulating layer 212 not covered by the mask pattern, thereby forming a second insulating layer pattern 212a, so that the device layer 208 in the sensor component region 220 is exposed from the second insulating layer pattern 212a. Also, the second insulating layer pattern 212a bridges the periphery region 218 and a portion of the sensor component region 220 of the device layer 208 (that is to say, the second insulating layer pattern 212a crosses the periphery region 218 and a portion of the sensor component region 220 of the device layer 208). As shown in FIG. 4b, the second insulating layer pattern 212a extends laterally to cover the air trenches 210 and a portion of the sensor component region 220. Finally, the mask pattern is removed.

Figure 5A:
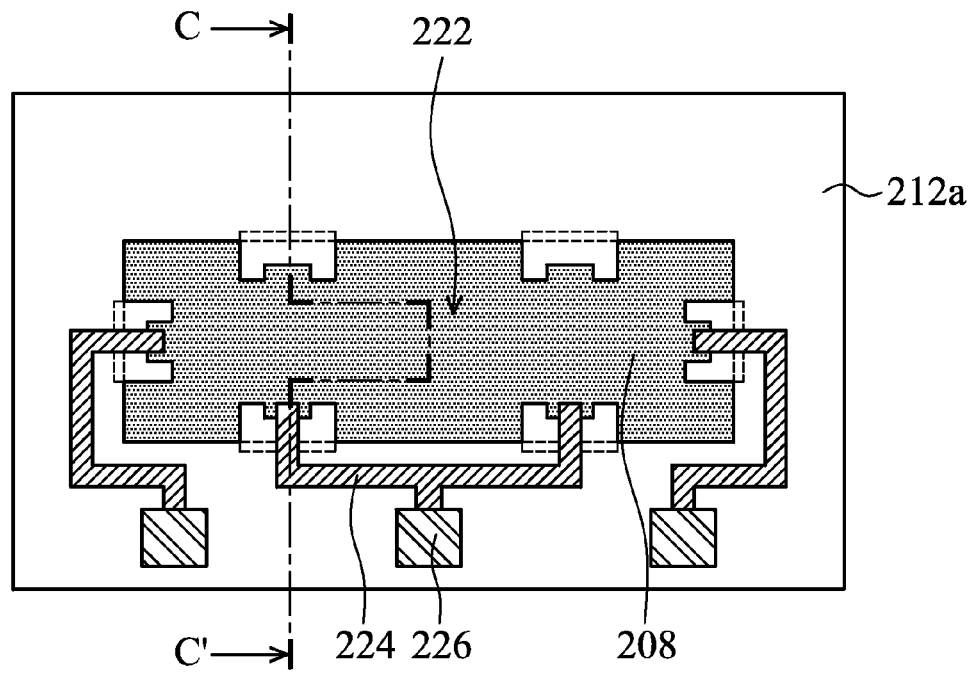
Figure 5B:
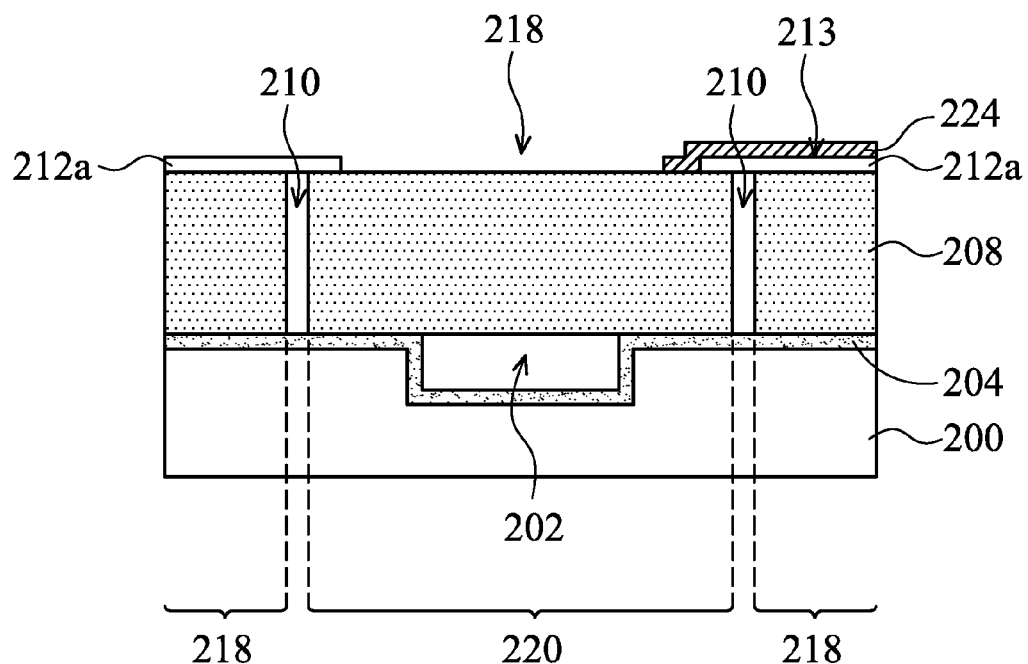
FIGS. 5b and 6b are cross sectional views taken along lines C-C' of FIGS. 5a, and 6a, respectively.

Next, please refer to FIGS. 5a and 5b, wherein an electroplating process and a patterning process are performed to form conductive patterns 224 on a top surface 213 of the second insulating layer pattern 212a. The conductive patterns 224 extend to connect to the device layer 208 exposed from the second insulating layer pattern 212a. In one embodiment, the conductive patterns 224 may comprise aluminum, copper, gold, silver, tungsten, or combinations thereof. The electroplating and patterning processes may further form conductive pads 226 connected to terminals of the conductive patterns 224. The conductive pads 226 can be used as input/output (I/O) electrical connections of the resulting MEMS-based sensor 500a. Also, the conductive pads 226 may comprise materials which are the same as the conductive patterns 224.

Figure 6A:
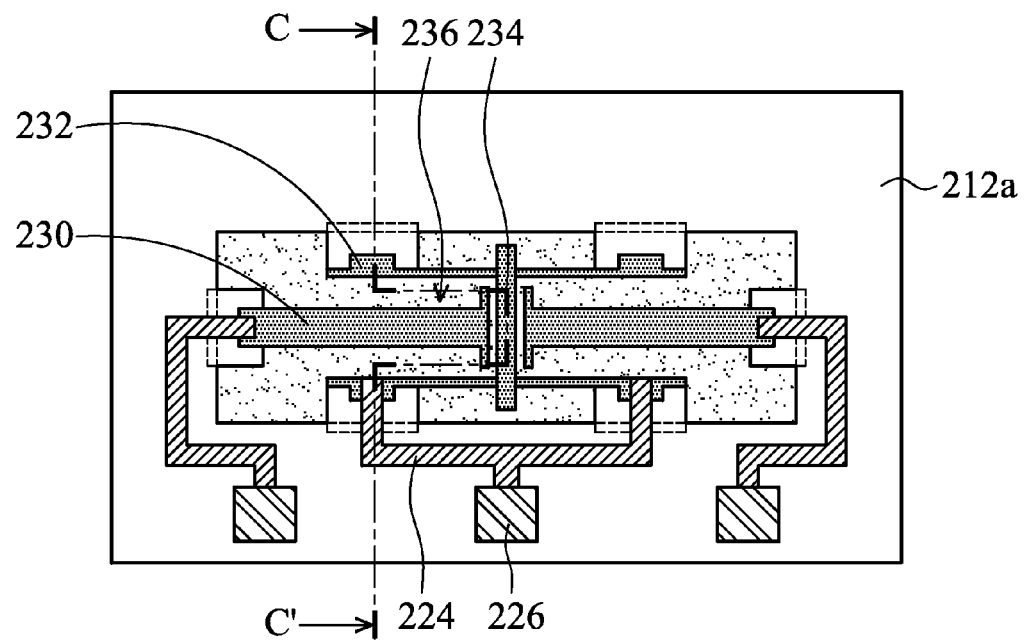
Figure 6B:
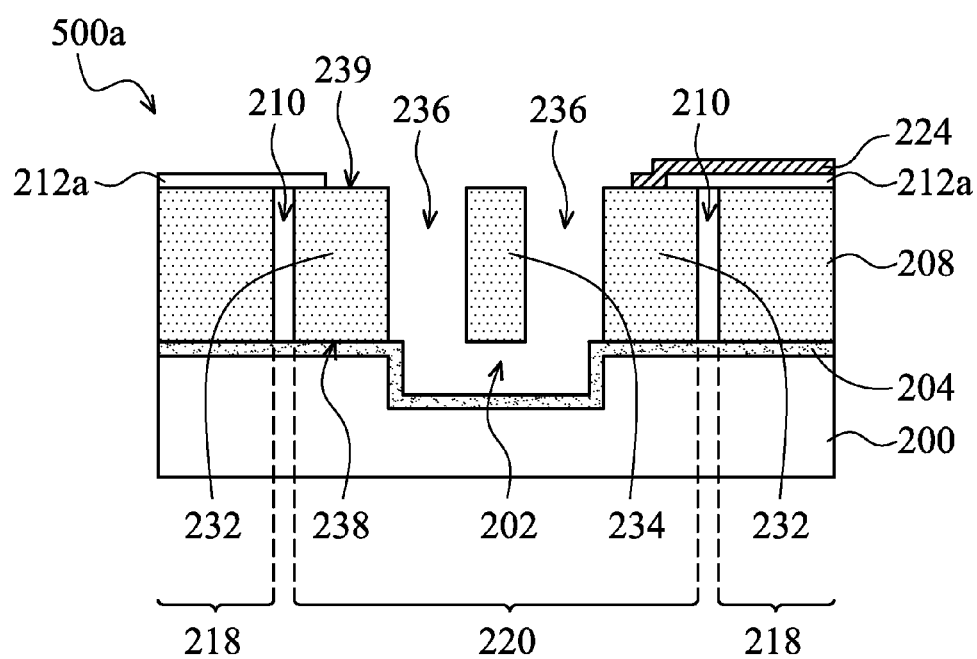

Next, please refer to FIGS. 6a and 6b, wherein a patterning process is performed to remove a portion of the device layer 208 exposed from the second insulating layer pattern 212a and form anchor components 232 and moveable components 234 in the sensor component region 220. As shown in FIG. 6a, the anchor component 232 can connect to the moveable component 234 through a flexible component, and another anchor component 232 is separated from the moveable component 234 by a spacing 236. As shown in FIG. 6b, in one embodiment where the substrate chip 200 has the recess region 202, the moveable component 234 is positioned in the recess region 202, isolated from the first insulating layer 204. The periphery region 218 and the anchor component 232 are respectively laterally adjacent to opposite sidewalls of the air trench 210. Also, the periphery region 218 and the anchor component 232 are adhered on the first insulating layer using a bonding process, so that the thermal stress is reduced. Therefore, the device stability is improved. Accordingly, the periphery region 218 can be totally separated from the anchor components 232 and the moveable components 234 in the sensor component region 220 without contacting to each other by the air trench 210 and the spacing 236. Bottom surfaces 238 of the periphery region 218, the anchor components 232 and the moveable components 234 can be separated from the substrate chip 200 thereunder by the first insulating layer 204. Additionally, the second insulating layer pattern 212a covers a portion of a top surface 239 of the anchor components 232. The conductive pattern 224 on the second insulating layer pattern 212a extends to cover a portion of the anchor components 232. The conductive pattern 224 only electrically connects to the anchor components 232. After performing the aforementioned processes, one exemplary embodiment of a MEMS-based sensor 500a is completely formed.

Figure 7:
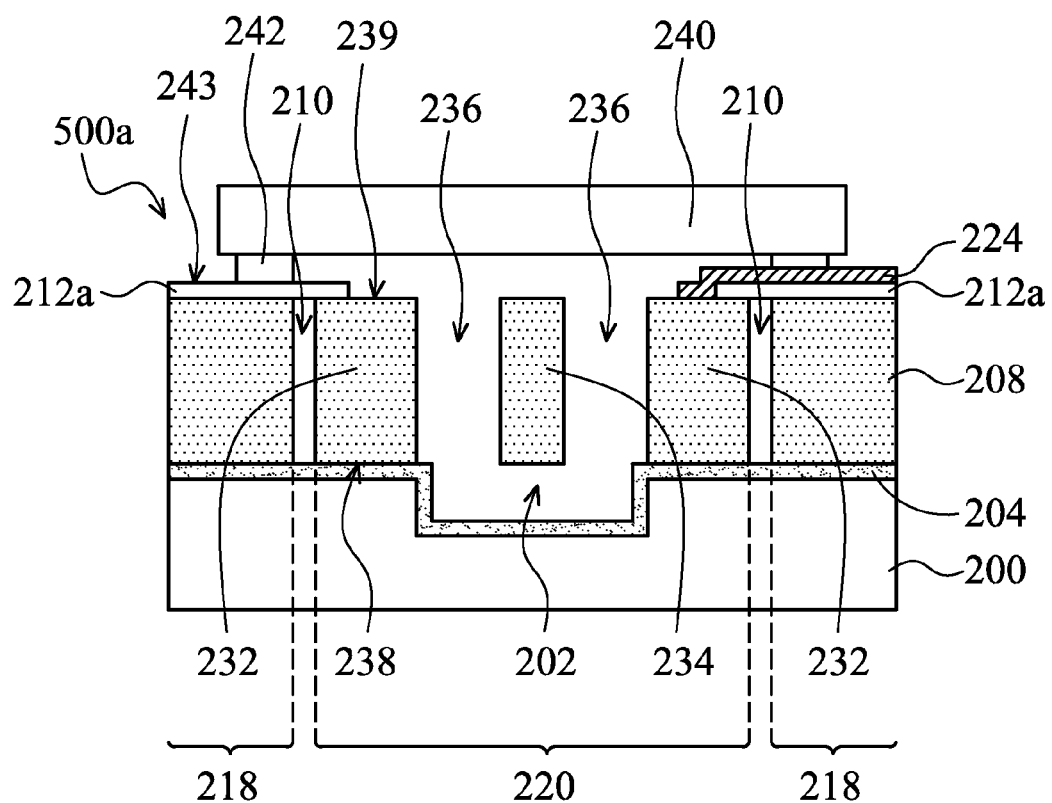
FIG. 7 is a cross sectional view showing one exemplary embodiment of a structure for a microelectromechanical system-based sensor of the invention.

As shown in FIG. 7, next, in another embodiment, another bonding process can be performed to dispose a capping layer 240 over the sensor component region 220, to bond to a top surface 243 of the periphery region 218 of the device layer 208 through a bonding pattern layer 242, for example, a glass fit bonding pattern layer. The capping layer 240 is separated from the sensor component region 220. Also, the bonding pattern layer 242 has a thickness and has a closed pattern from a top view. Therefore, the spacing 236 can be formed as a chamber after the bonding pattern layer 242 bonds to the capping layer 240, so that the moveable components 234 can move in the chamber without touching the capping layer 240. In one embodiment, the capping layer 240 may be a semiconductor chip, for example, a silicon chip. And the capping layer 240 is used to protect the anchor components 232 and the moveable components 234 in the sensor component region 220.

Figure 8:
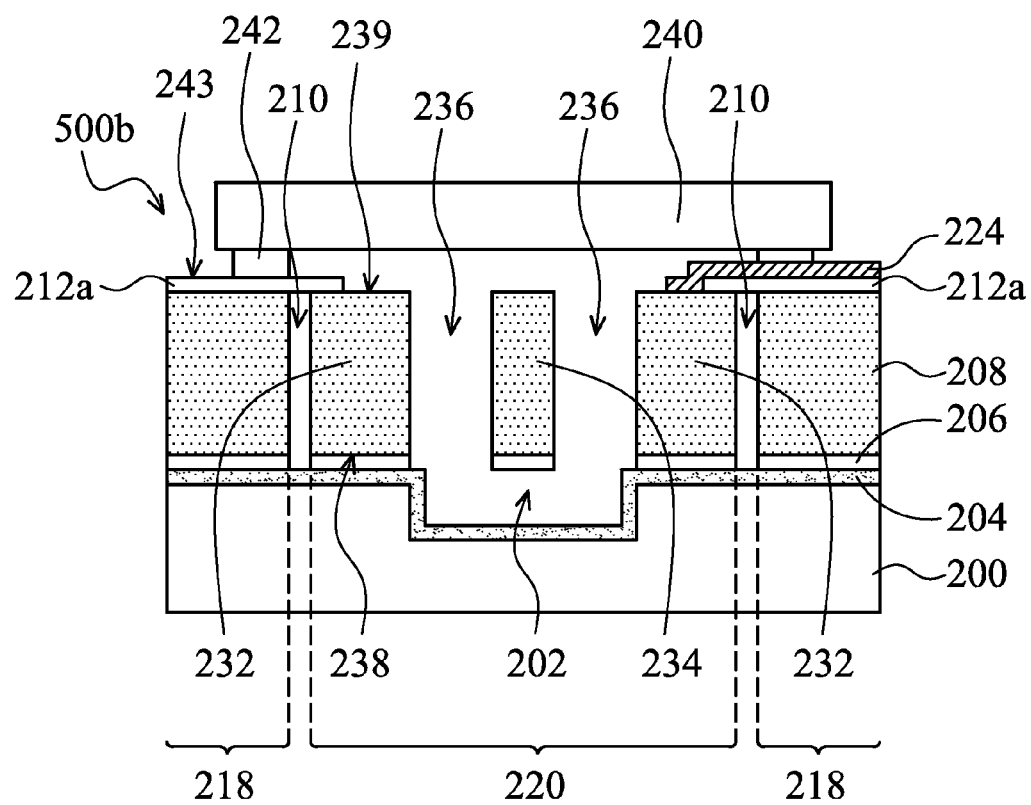
FIG. 8 is a cross sectional view showing another exemplary embodiment of a structure for a microelectromechanical system-based sensor of the invention.

FIG. 8 is a cross sectional view showing another exemplary embodiment of a structure for a microelectromechanical system-based sensor 500b of the invention. In the other embodiment, the device layer 208 is bonded to the top surface 205 of the first insulating layer 204 through a bonding layer 206. In one embodiment, the bonding layer 206 may comprises an insulating layer or a metal layer.

Exemplary embodiments provide a structure and a fabrication process for a MEMS-based sensor of the invention with the following advantages. A silicon substrate chip is used to replace the glass substrate of the conventional MEMS-based sensor. Therefore, total thickness of the MEMS-based sensor can be dramatically thinned without the limitation of insufficient glass polishing process technology. Additionally, the conductive patterns of the anchor components originally designed on the glass substrate of the conventional MEMS-based sensor can be moved to top surfaces of the anchor components without requiring thin conductive wires for protecting the glass substrate thereunder. One exemplary embodiment of a fabrication process for a MEMS-based sensor of the invention can save two process masks, one for the oxide layer to protect the wafer during the high temperature bonding process, and another for the physical embedding process of the terminal surfaces of the anchor components of the conventional MEMS-based sensor. Therefore, exemplary embodiments of the structure and the fabrication process for the MEMS-based sensor of the invention have a simplified device fabrication process, reduced fabrication costs, and improved device stability and the device reliability.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A structure for a MEMS-based sensor, comprising:
a substrate chip;
a first insulating layer covering a top surface of the substrate chip;
a device layer disposed on a top surface of the first insulating layer, wherein the device layer comprises a periphery region and a sensor component region, and the periphery region and a sensor component region have an air trench therebetween, and wherein the component region includes an anchor component and a moveable component;
a second insulating layer disposed on a top surface of the device layer, bridging the periphery region and a portion of the anchor component; and
a conductive pattern disposed on the second insulating layer, electrically connecting to the anchor component.

2. The structure for the MEMS-based sensor as claimed in claim 1, wherein the substrate chip comprises a recess region for the moveable component to be disposed therein and is isolated from the first insulating layer.

3. The structure for the MEMS-based sensor as claimed in claim 1, further comprising a bonding layer disposed between the substrate chip and the first insulating layer.

4. The structure for the MEMS-based sensor as claimed in claim 1, wherein the second insulating layer extends from the periphery region to cover a top of the air trench.

5. The structure for the MEMS-based sensor as claimed in claim 1, wherein the periphery region and the anchor component are respectively laterally adjacent to the air trench, adhered on the first insulating layer.

6. The structure for the MEMS-based sensor as claimed in claim 1, further comprising a capping layer disposed over the sensor component region, bonding to the sensor component region, wherein the capping layer is separated from the sensor component region.

7. The structure for the MEMS-based sensor as claimed in claim 1, wherein the substrate chip is a silicon substrate chip.

8. The structure for the MEMS-based sensor as claimed in claim 1, wherein the periphery region surrounds the sensor component region.

* * * * *